United States Patent [19]

Hideshima et al.

[11] Patent Number: 4,698,127

[45] Date of Patent: Oct. 6, 1987

[54] PROCESS FOR FABRICATING A SELF-ALIGNED BIPOLAR TRANSISTOR

[75] Inventors: Osamu Hideshima, Kawasaki; Hiroshi Goto, Yokohama, both of Japan

[73] Assignee: Fujitsu Limited, Kawasaki, Japan

[21] Appl. No.: 850,054

[22] Filed: Apr. 10, 1986

[30] Foreign Application Priority Data

Apr. 10, 1985 [JP] Japan .................................. 60-76055
Jun. 26, 1985 [JP] Japan ................................ 60-137694
Aug. 20, 1985 [JP] Japan ................................ 60-182262

[51] Int. Cl.$^4$ ..................... H01L 21/04; H01L 21/22; H01L 21/306; B44C 1/22
[52] U.S. Cl. ................................. 156/643; 156/646; 156/648; 156/653; 156/657; 156/659.1; 357/43; 437/26
[58] Field of Search ............... 29/571, 576 B, 576 W, 29/591; 148/1.5, 187, 190; 156/643, 646, 648, 653, 657, 659.1, 661.1, 662; 357/34, 43, 49, 91; 427/85, 86, 93; 204/192.32

[56] References Cited

U.S. PATENT DOCUMENTS 4,444,620 4/1984 Kovacs et al. ...................... 156/657
4,584,055 4/1986 Kayanuma et al. ............. 156/657 X
4,591,398 5/1986 Ouchi et al. ......................... 148/187

*Primary Examiner*—William A. Powell
*Attorney, Agent, or Firm*—Staas & Halsey

[57] ABSTRACT

Using a single mask pattern on a semiconductor substrate, a doped base contact region adjacent to the surface of the substrate, a buried insulating region below the base contact region, and an insulating layer on the base contact region, and optionally, a metal or metal silicide base-electrode-taking-out layer on the base contact region, are formed, respectively. Doped emitter and intrinsic base regions are formed below the mask pattern. A collector region is defined by the base contact region and the buried insulating layer to be inside thereof, i.e., below the mask pattern. Thus, a bipolar transistor is formed in a size that is essentially necessary, thereby reducing the collector-base capacitance, the base resistance, and the size of the device.

17 Claims, 9 Drawing Figures

PROCESS FOR FABRICATING A SELF-ALIGNED BIPOLAR TRANSISTOR

BACKGROUND OF THE INVENTION

1. Field of the Invention

The present invention relates to a process for fabricating a bipolar transistor. More specifically, it relates to a process for fabricating a self-aligned bipolar transistor with a reduced collector-base junction capacitance and base resistance.

2. Description of the Related Art

A typical bipolar transistor comprises a semiconductor substrate having an n-type epitaxial semiconductor layer at the surface side thereof, in which an n-type region is isolated by an pn-junction or an insulating region to constitute a collector region. A base region is a p-type doped region formed in the collector region at the surface of the epitaxial layer, and an emitter region of an $n^+$-type doped region is formed in the base region. An emitter electrode is formed on the surface of the $n^+$-type emitter region and a base electrode is formed on the surface of the p-type base region.

In this typical bipolar transistor, the base region must have a considerably larger area than that of the emitter, in order to provide insulation between the emitter and base electrodes based on a mask alignment. However, preferably the area of the base region should be as small as possible, since an essential active portion of the base region necessary for transistor operation is only the portion underlying the emitter region. The other portion of the base region, which is used only for taking out a base electrode, increases the base resistance and the collector base junction capacitance, decreasing the operating speed of the transistor, and prevents an increase of the integration degree of the device.

In order to alleviate the above problems, a bipolar transistor has been proposed in which an intrinsic base region is formed to have an area essentially necessary for transistor operation and a base-electrode taking-out portion is made of polycrystalline silicon (T. Nakamura et al., "Self-Aligned Transistor with Sidewall Base Electrode", IEEE TRANSACTIONS ON ELECTRON DEVICES, VOL. ED-29, No. 4, April 1982, 596–600). In this transistor, the area of the collector-base junction is small so that the collector-base junction capacitance is reduced and the operating speed of the transistor is increased. However, this device is fabricated by a process which is undesirably complex.

SUMMARY OF THE INVENTION

The object of the invention is to alleviate the above problems and to provide a simple process for fabricating a self-aligned bipolar transistor with a reduced base resistance and collector-base capacitance.

The above and other objects, features and advantages of the present invention are attained by a process for fabricating a bipolar transistor, comprising the steps of: preparing a semiconductor substrate; defining a first doped region of a first conductivity type in the semiconductor substrate adjacent to the surface of the semiconductor substrate; forming a mask layer on the first doped region, the mask layer having a pattern corresponding to that of an active area of the transistor to be formed; locally implanting ions into the first doped region, using the mask layer as a mask, to form a buried insulating layer; locally introducing dopants into the first doped region at the surface of the substrate and above the buried insulating layer, using the mask layer as a mask, to form a base contact region of a second conductivity type opposite to the first conductivity type; forming an intrinsic base region of the second conductivity type in the first doped region adjacent to the base contact region; forming an emitter region of the first conductivity type in the intrinsic base region; and using the first doped region of the first conductivity type below the intrinsic base region as a collector.

In this process, a metal or metal silicide layer, preferably or refractory metal or silicide thereof, may be inserted between the base contact region and the second insulating layer to reduce the base resistance. Such a metal or metal silicide layer may be formed by locally depositing a metal or metal silicide onto the base contact region, optionally followed by siliciding the deposited metal. In this case, a second insulating layer is formed above the base contact region. The second insulating layer may be formed by oxidizing, e.g., thermal oxidizing or anodizing, the surface of the base contact region itself or the surface of the above-mentioned metal or metal silicide layer, or by depositing an insulating material such as silicon dioxide on the base contact region or on the above-mentioned metal or metal silicide layer, or a combination thereof.

BRIEF DESCRIPTION OF THE DRAWINGS

The present invention is hereinafter described in detail with reference to the drawings, in which.

DESCRIPTION OF THE PREFERRED EMBODIMENTS

Before describing the present invention in detail, the prior art is briefly described with reference to the drawings.

Figure 1:
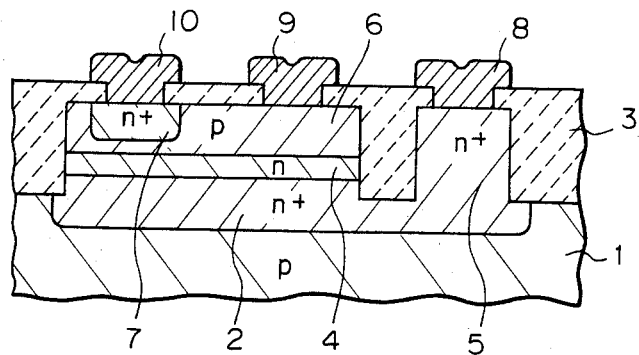
FIG. 1 is a sectional side view of a typical bipolar transistor in the prior art.

FIG. 1 illustrates a typical bipolar transistor in the prior art, in which reference numeral 1 denotes a p-type semiconductor substrate, 2 an $n^+$-type buried region, 3 an isolation insulating region, 4 an n-type epitaxial semiconductor layer or a collector region, 5 an $n^+$-type collector contact region, 6 a p-type base region, 7 an $n^+$-type emitter region, 8 a collector electrode, 9 a base electrode, and 10 an emitter electrode. In this transistor, the p-type base region 6 is considerably large in order to provide a proper insulation between the base and emitter electrodes 9 and 10.

Figure 2:
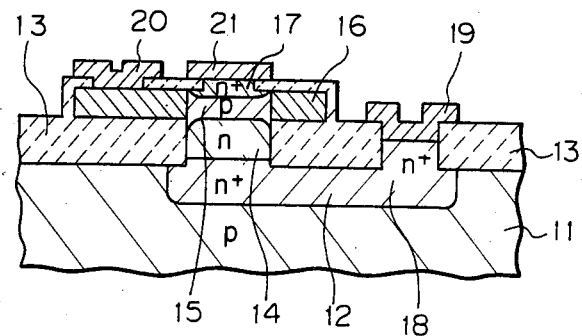
FIG. 2 is a sectional side view of a self-aligned bipolar transistor in the prior art.

FIG. 2 illustrates a self-aligned bipolar transistor proposed by T. Nakamura et al in "Self-Aligned Transistor with Sidewall Base Electrode", mentioned before. In FIG. 2, reference numeral 11 denotes a p-type silicon substrate, 12 an $n^+$-type buried region, 13 an silicon dioxide layer, 14 an n-type collector region, 15 a p-type intrinsic base region, 16 a $p^+$-type extrinsic base region, 17 an $n^+$-type emitter region, 18 an $n^+$-type collector contact region, 19 a collector electrode, 20 a base electrode, and 21 an emitter electrode. This bipolar transistor is fabricated by (1) locally etching the n-type epitaxial layer except at the portion where the collector region 14 and the intrinsic base region 15 are to be formed, (2) oxidizing the exposed surface of the epitaxial layer to form the oxide layer 13, (3) depositing and patterning polycrystalline silicon to form the extrinsic base region 16, (4) carrying out doping in a portion of the n-type epitaxial layer to form the p-type intrinsic base region 15, (5) oxidizing the surface of the polycrystalline extrinsic base region 16, and (6) carrying out doping in a portion of the p-type intrinsic base region 15 to form the n$^+$-type emitter region. This fabrication process is rather complex.

FIGS. 3 to 6 illustrate a process for fabricating a self-aligned bipolar transistor according to the present invention.

Figure 3:
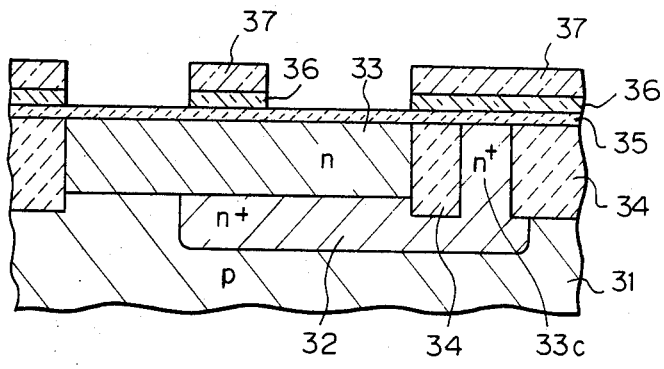
FIGS. 3 to 6 are sectional side views of a bipolar transistor in main steps in a process for fabrication according to the present invention.

Referring to FIG. 3, the reference numeral 31 denotes a p-type silicon substrate; 32 an n$^+$-type buried region formed by implanting arsenic ions at an energy of 60 KeV and a dosage of $10^{16}$ cm$^{-2}$ into the silicon substrate 31; 33 an n-type epitaxially grown silicon layer; 34 a locally oxidized layer for isolation; 33c an n$^+$-type collector contact region formed by phosphorus ion implantation at 100 keV and $5 \times 10^{15}$ cm$^{-2}$; 35 a silicon dioxide (SiO$_2$) layer having a thickness of 50 nm 36 a silicon nitride (Si$_3$N$_4$) layer having a thickness of 150 nm, as an anti-oxidation layer, formed by chemical vapor deposition (CVD); and 37 a phosphosilicate glass (PSG) layer having a thickness of 1 to 1.5 μm, formed by CVD.

The SiO$_2$ layer 35 is formed by thermal oxidization in dry oxygen at 1000° C. The Si$_3$N$_4$ layer 36 is deposited by thermal decomposition of a gaseous mixture of monosilane (SiH$_4$) and ammonia (NH$_3$) under a reduced pressure of 1 Torr at 900° C. The PSG layer 37 is deposited by thermal decomposition of a gaseous mixture of SH$_4$ and phosphine (PH$_3$) under a reduced pressure of 300 Torr at 400° C.

By a conventional lithography, a resist pattern (not shown) is formed on the PSG layer 37 in a portion under which the active region of a bipolar transistor is to be formed. The PSG and Si$_3$N$_4$ layers are locally etched by reactive ion etching (RIE), using the resist pattern as a mask. The RIE is carried out by applying an electric power of 100 W at a radio frequency of 13.56 MHz in a reduced atmosphere of trifluoromethane (CHF$_3$) as an etching gas. The thus locally etched PSG and Si$_3$N$_4$ layers 37 and 36 are shown in FIG. 3.

Figure 4:
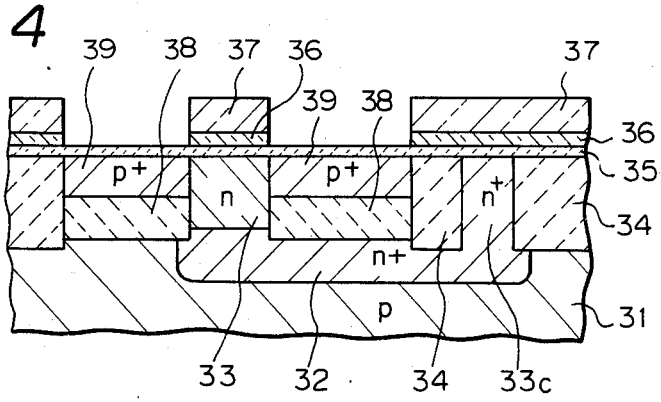

Referring to FIG. 4, oxygen ions are implanted into the n-type epitaxial layer 33 and the substrate 31 spaced below the surface of the epitaxial layer 33, using the PSG and Si$_3$N$_4$ layers 37 and 36 as a mask, to form a buried insulation region 38. The implantation of oxygen ions is conducted at 200 keV and $10^{18}$ cm$^{-2}$. After implantation, annealing at 1100° to 1200° C. in a nitrogen atmosphere is carried out to stabilize the buried insulating region 38, i.e., SiO$_2$ region. Nitrogen ions, for example, may be implanted in place of oxygen ions to form the buried insulating region 38, i.e., Si$_3$N$_4$ region.

Further, boron ions are implanted into the n-type epitaxial layer 33 in a region from the surface thereof to the buried insulating region 38, using the PSG and Si$_3$N$_4$ layers 37 and 36 as a mask, to form a p$^+$-type base contact region (extrinsic base region) 39. The implantation of boron ions is conducted at 30 keV and $10^{15}$ cm$^{-2}$. This implantation of boron may be carried out without the PSG layer 37.

The sequence of the steps of the implantation of oxygen and boron, i.e., formation of the buried insulating region 38 and the base contact region 39 may be reversed.

Figure 5:
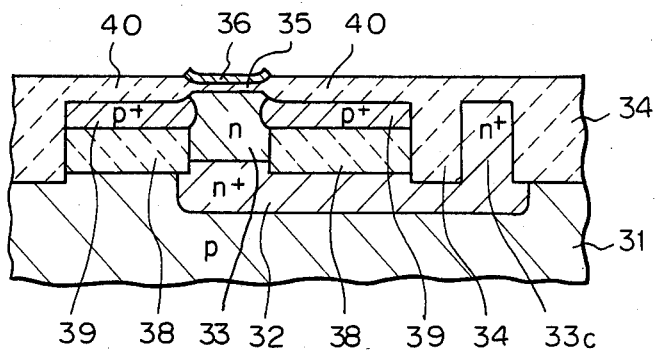

Referring to FIG. 5, the entire PSG layer 37, and the Si$_3$N$_4$ layer 36 except a region for transistor operation, are removed and thermal oxidization is carried out, using the Si$_3$N$_4$ layer 36 as a mask, to form an SiO$_2$ layer 40 having a thickness of 300 nm as a field oxidized layer defining the region of operation of the transistor therein. The oxidization is conducted by thermal oxidization in dry oxygen at 900° C.

The Si$_3$N$_4$ layer 36 is removed by etching with hot phosphoric acid.

Figure 6:
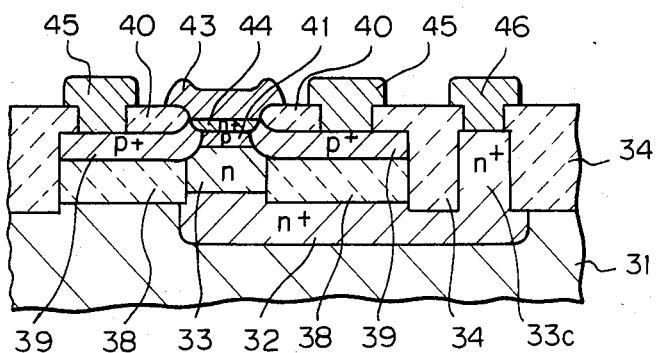

Referring to FIG. 6, using the field SiO$_2$ layer 40 as a mask, boron ions are implanted at 30 keV and $10^{14}$ cm$^{-2}$ to form a p-type intrinsic base region 41.

The SiO$_2$ layer 35 is then removed by fluoric acid to expose the surface of the epitaxial layer, which now has a p-type conductivity adjacent to the surface thereof. A polycrystalline silicon layer doped with arsenic at $10^{21}$ cm$^{-3}$ is deposited by CVD over the entire surface in a thickness of 300 nm, which is then patterned to leave the polycrystalline layer only in a region for operation of the transistor, forming an emitter electrode 43. Alternatively, a non-doped polycrystalline silicon layer is deposited over the entire surface, followed by implanting arsenic ions at 150 keV and $10^{16}$ cm$^{-2}$ and patterning to form the emitter electrode 43. The CVD of the polycrystalline silicon is conducted by thermally decomposing SiH$_4$ gas under a reduced pressure of 1 Torr at 600° C.

An annealing or emitter drive is carried out at 950° C. for 20 minutes to form an n$^+$-type emitter region 44.

The emitter region 44 may be made by ion implantation, etc.

Thus, the main parts of a bipolar transistor are fabricated. Then, a base electrode of, e.g., aluminum, is formed on the field SiO$_2$ layer 40 to make contact with the base contact region 39 through a window formed in the field SiO$_2$ layer 40. A collector electrode 46 of, e.g., aluminum, is made concurrently with the base electrode 45.

Thus, a self-aligned bipolar transistor is simply fabricated in accordance with the present invention. In this process, the buried insulating region 38, the p$^+$-type base contact region 39 and the field SiO$_2$ layer 40 are made in alignment with the pattern of the original Si$_3$N$_4$ and PSG layers 36 and 37. Further, the p-type intrinsic base region 41 and n$^+$-type emitter region 44 also may be made in alignment with the thus formed field SiO$_2$ layer 40. Thus, all of these layers are made from only one mask pattern.

In this bipolar transistor, the emitter region 44, the intrinsic base region 41, and the collector region 33 are made so that they involve only a region essentially necessary for transistor operation, furthermore, there is the buried insulating region 38 between the base contact-region 39 and the collector region 33 and 32, thus reducing the collector-base junction capacitance and the base resistance. The reduced base resistance is also due to a reduced resistance of the p$^+$-type base contact region 39 due to a high concentration of dopants in a single crystalline region, which is enabled by a process according to the present invention.

Figure 7:
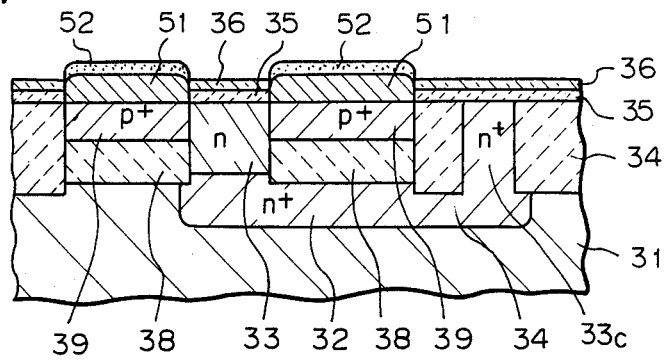
FIGS. 7 to 9 are sectional side views of a bipolar transistor in main steps in another process for fabrication according to the present invention.
Figure 8:
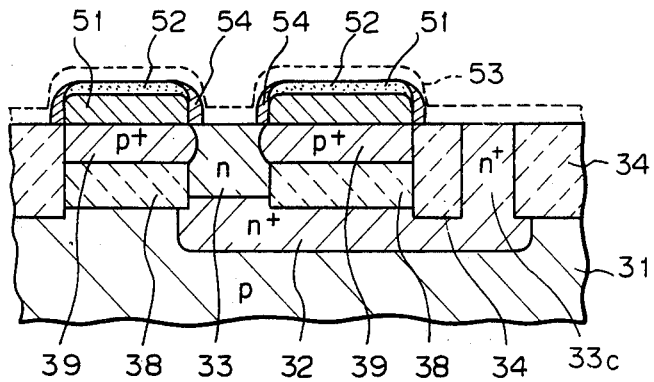
Figure 9:
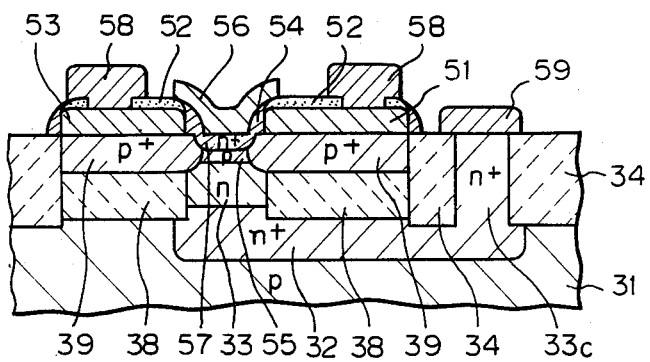

FIGS. 7 to 9 illustrate another embodiment of a process for fabricating a bipolar transistor according to the present invention. Also in this process, the same procedures described before with reference to FIGS. 3 and 4 may be carried out.

Thus, after forming the buried insulating region 38 and the p+-type base contact region 39, referring to FIG. 7, the $SiO_2$ layer 35 on the p+-type base contact region 39 is locally removed to expose the surface of the base contact region 39. Onto the exposed base contact region 39, tungsten is locally deposited to form a tungsten layer 51 having a thickness of 100 nm. This local deposition is conducted by CVD from a gaseous mixture of tungsten fluoride ($WF_6$) and argon or nitrogen at a reduced pressure of 0.1 to 5 Torr at a low temperature of 250° to 500° C. (see, E. K. Broadbent and C. L. Ramiller "Selective Low Pressure Chemical Vapor Deposition of Tungsten", J. Electrochem. Soc. SOLID-STATE SCIENCE AND TECHNOLOGY, June 1984, pp 1427-1433). This tungsten layer 51 may be converted to silicide $WSi_2$ by annealing at 600° to 1000° C.

Alternatively, titanium silicide ($TiSi_2$) may be locally deposited onto the exposed base contact region 39 to form a $TiSi_2$ layer having a thickness of 100 nm. This local deposition is conducted by CVD from a gaseous mixture of tetrachlorotitanium ($TiCl_4$) and trichlorosilane ($SiHCl_3$) in a carrier gas of hydrogen under a pressure of less than 100 Torr at 600° to 900° C. (see Japanese Patent Application No. 60-23480).

Further, implantation of boron ions to form the p+-type base contact region may be carried out after the metal or metal silicide layer 51 is formed, not before.

After the metal or metal silicide layer, for example, $WSi_2$ layer 51, as a base-taking-out electrode, is formed, the surface thereof is oxidized by anodizing to form an anodized film 52. The surface of the $WSi_2$ layer 51 may be oxidized by thermal oxidation. If thermal oxidization is effected, an anti-oxidization layer 36 is necessary where an emitter is to be formed. Annealing is then conducted at 600° to 1000° C. to accelerate the alloying of the $WSi_2$ layer 51.

The metal or metal silicide layer 51 may be formed by a process other than local deposition, for example, by a lift-off technique.

Referring to FIG. 8, the $Si_3N_4$ layer 36 is removed and an $SiO_2$ layer 53 having a thickness of 200 nm, shown by a broken line in FIG. 8, is formed by CVD, followed by RIE, to remove the $SiO_2$ layer 53 uniformly from the surface, leaving a side wall 54. The thickness of the side wall 54 may be controlled by the degree of RIE. In this RIE, the surface of the epitaxial region 33 is exposed, but the $SiO_2$ layer 53 may be left on the anodized film 52.

The formation of the $SiO_2$ layer 53 by CVD is not always necessary. After anodizing the surface of the $TiSi_2$ layer 51, local etching may be conducted to open a window in the $Si_3N_4$ and $SiO_2$ layers 36 and 35 where an emitter region is to be formed.

Referring to FIG. 9, a p-type intrinsic base region 55, a polycrystalline emitter electrode 56, an n+-type emitter region 57, a base electrode 58, and a collector electrode 59 may be formed by similar procedures to those described before with reference to FIG. 6.

Thus, a self-aligned bipolar transistor is accomplished. This bipolar transistor not only has the same advantages as those of the former bipolar transistor in FIG. 6, but also has an advantage in that the base resistance is further reduced since the intrinsic base region 55 and the base electrode 58 are electrically connected through the metal or metal silicide layer 51, which has a lower electrical resistance than the p+-type doped semiconductor region 39.

We claim:
1. A process for fabricating a bipolar transistor, comprising the steps of:
   preparing a semiconductor substrate;
   defining a first doped region of a first conductivity type adjacent to the surface of the semiconductor substrate;
   forming a mask layer on the first doped region, the mask layer having a pattern corresponding to that of an active area of the transistor to be formed;
   locally implanting ions into the first doped region, using the mask layer as a mask, to form a buried insulating layer;
   locally introducing dopants in the first doped region at the surface of the substrate and above the buried insulating layer, using the mask layer as a mask, to form a base contact region of a second conductivity type opposite to the first conductivity type;
   forming an intrinsic base region of the second conductivity type in the first doped region adjacent to the base contact region;
   forming an emitter region of the first conductivity type in the intrinsic base region and adjacent to the surface of the substrate; and
   using the first doped region of the first conductivity type below the intrinsic base region as a collector.

2. A process according to claim 1, wherein the step of forming the buried insulating region is prior to the step of forming the base contact region.

3. A process according to claim 1, wherein the step of forming the base contact region is prior to the step of forming the buried insulating layer.

4. A process according to claim 1, wherein the step of forming the intrinsic base region is prior to the step of forming the emitter region.

5. A process according to claim 1, wherein the step of forming the emitter region is prior to the step of forming the intrinsic base region.

6. A process according to claim 1, further comprising the step of locally forming a second insulating layer above the base contact region.

7. A process according to claim 6, wherein the second insulating layer is formed by locally insulating the surface of the base contact region, using said mask layer as a mask.

8. A process according to claim 7, further comprising the step of opening a window in the second insulating layer to expose the surface of the base contact region in the window, followed by forming a base electrode in contact with the base contact layer through the window.

9. A process according to claim 6, further comprising the step of locally forming a metal or metal silicide layer on the base contact layer before the step of forming the second insulating layer.

10. A process according to claim 9, wherein the metal or metal silicide layer is formed by local deposition of a metal or metal silicide, onto the base contact region or by local deposition of a metal on the base contact region followed by silicidation of the deposited metal.

11. A process according to claim 9, wherein the second insulating layer is formed by making the surface of the metal or metal silicide layer insulating.

12. A process according to claim 11, wherein the second insulating layer is formed by anodizing the surface of the metal or metal silicide layer.

13. A process according to claim 9, wherein at least a part of the second insulating layer is formed by depositing an insulating material above the metal or metal silicide layer.

14. A process according to claim 13, wherein after depositing the insulating material above the metal or metal silicide layer and above the first doped region where at least a part of the mask layer is removed, anisotropic etching is conducted to remove the insulating material except the side wall portion of the metal or metal silicide layer, whereby an insulating wall having a desired lateral thickness of the insulating wall is formed at the side wall portion of the metal or metal silicide layer.

15. A process according to claim 1, wherein the semiconductor substrate is of silicon.

16. A process according to claim 1, wherein the buried insulating region is formed by implanting oxygen or nitrogen ions there.

17. A process according to claim 10, wherein the locally deposited metal or metal silicide is a refractory metal or a silicide thereof.

* * * * *